(12) United States Patent
Kao et al.

(10) Patent No.: US 7,220,650 B2
(45) Date of Patent: May 22, 2007

(54) SIDEWALL SPACER FOR SEMICONDUCTOR DEVICE AND FABRICATION METHOD THEREOF

(75) Inventors: Rong-Hui Kao, Hsinchu (TW); Chang-Sheng Tsao, Taipei (TW); Yen-Ming Chen, Hsinchu (TW); Lin-June Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 167 days.

(21) Appl. No.: 10/821,438

(22) Filed: Apr. 9, 2004

(65) Prior Publication Data

US 2005/0227446 A1    Oct. 13, 2005

(51) Int. Cl.
*H01L 21/336* (2006.01)
(52) U.S. Cl. ............ 438/303; 438/305; 257/E21.131
(58) Field of Classification Search ........... 438/305, 438/392, 595
See application file for complete search history.

(56) References Cited

U.S. PATENT DOCUMENTS

| 5,981,325 | A | 11/1999 | Hung ..................... 438/224 |
| 6,121,099 | A | 9/2000 | Fulford, Jr. et al. |
| 6,140,203 | A * | 10/2000 | Schuegraf et al. ......... 438/396 |
| 6,187,645 | B1 | 2/2001 | Lin et al. .................. 438/305 |
| 6,423,632 | B1 * | 7/2002 | Samavedam et al. ....... 438/652 |
| 6,498,067 | B1 * | 12/2002 | Perng et al. ............... 438/305 |
| 6,528,402 | B2 * | 3/2003 | Tseng ....................... 438/592 |

OTHER PUBLICATIONS

China Office Action issued May 19, 2006.

* cited by examiner

*Primary Examiner*—Scott B. Geyer
*Assistant Examiner*—Elias Ullah
(74) *Attorney, Agent, or Firm*—Thomas, Kayden, Horstemeyer & Risley (57) ABSTRACT

An offset spacer layer for an LDD ion implantation process is formed by blanket deposition without photolithography and dry etch processes. The offset spacer layer remaining on LDD regions during an ion implantation process prevents a substrate from silicon loss and dosage contamination and has densified characteristics to improve device reliability.

8 Claims, 6 Drawing Sheets

SIDEWALL SPACER FOR SEMICONDUCTOR DEVICE AND FABRICATION METHOD THEREOF

BACKGROUND

The present invention relates to metal oxide semiconductor (MOS) devices, and particularly to an offset spacer for MOS device improvement in deep sub-micron processes.

The trend in developing very large scale integration (VLSI) circuits is towards devices having smaller line width on a larger silicon chip, thus more functions can be integrated into an integrated circuit within a given size. Current efforts continue to design semiconductor devices, such as metal-oxide-semiconductor field effect transistors (MOSFETs), which occupy less physical space, consume less power and operate at higher switching speed at lower voltage. Miniaturization of MOS device brings the source and drain terminals closer to each other. When the channel length is reduced, the degree of overlapping of the depletion region in the source/drain terminal with the channel is increased. Hot-electron effect usually accompanies in the reduced channel length and affects operation speed of the MOS device. To resolve the problems, advanced CMOS processes add a lightly doped drain (LDD) region between the channel region and each source/drain region to minimize hot-electron effect, especially if the devices are NMOS devices. Nevertheless, the high concentration LDD terminals often result in large overlapping with a gate conductive layer after annealing and thermal treatments. When appropriate bias voltages are applied to the MOSFET structure, an overlap capacitance developed in an area between the gate conductive layer and the LDD region can lead to abnormal bias and a reduction of AC performance of the device.

An offset spacer developed on sidewalls of the gate conductive layer is used to lower the overlap capacitance between the gate conductive layer and the LDD region, thereby increasing operation speed, reducing gate leakage and improving drain-induced barrier lowering (DIBL) effect in the MOSFET structure. The thickness of the offset spacer is modified to adjust the channel length and improve the punch-through margins. In U.S. Pat. No. 5,981,325 a channel length adjustment procedure using offset spacers is taught. In U.S. Pat. No. 6,187,645 a method of preventing gate-to-drain capacitance in a MOS device with offset spacers is described.

Figure 1A:
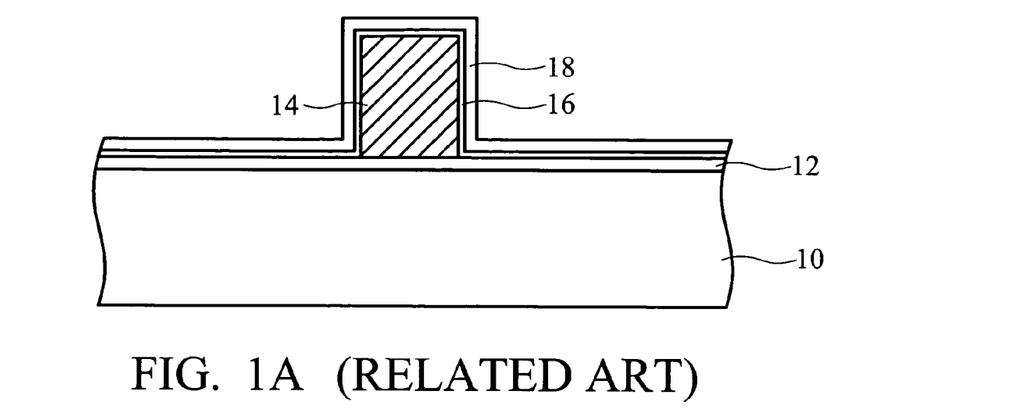
FIGS. 1A through 1C are cross-sectional diagrams illustrating a conventional method of forming a MOS transistor with an offset spacer structure on sidewalls of a gate conductive layer.
Figure 1B:
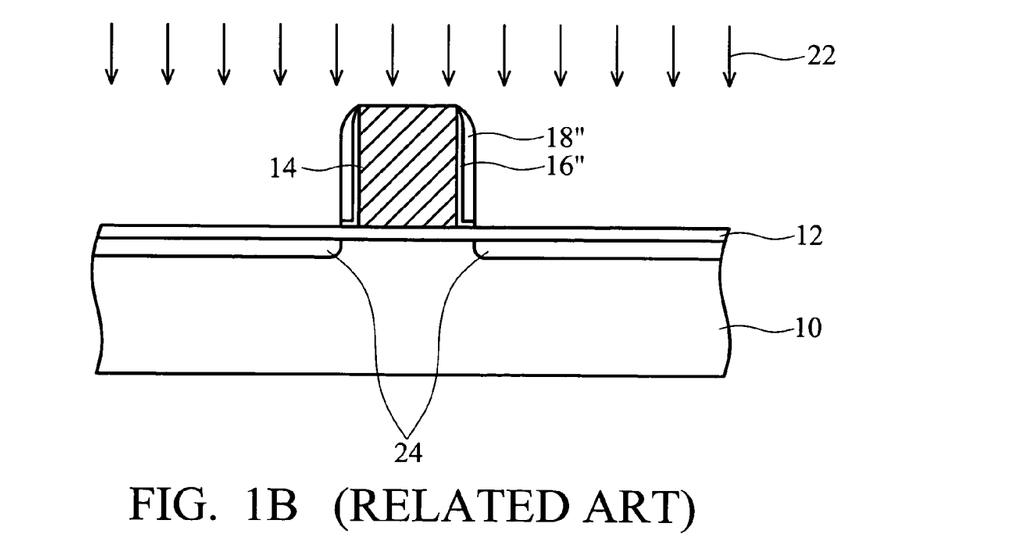
Figure 1C:
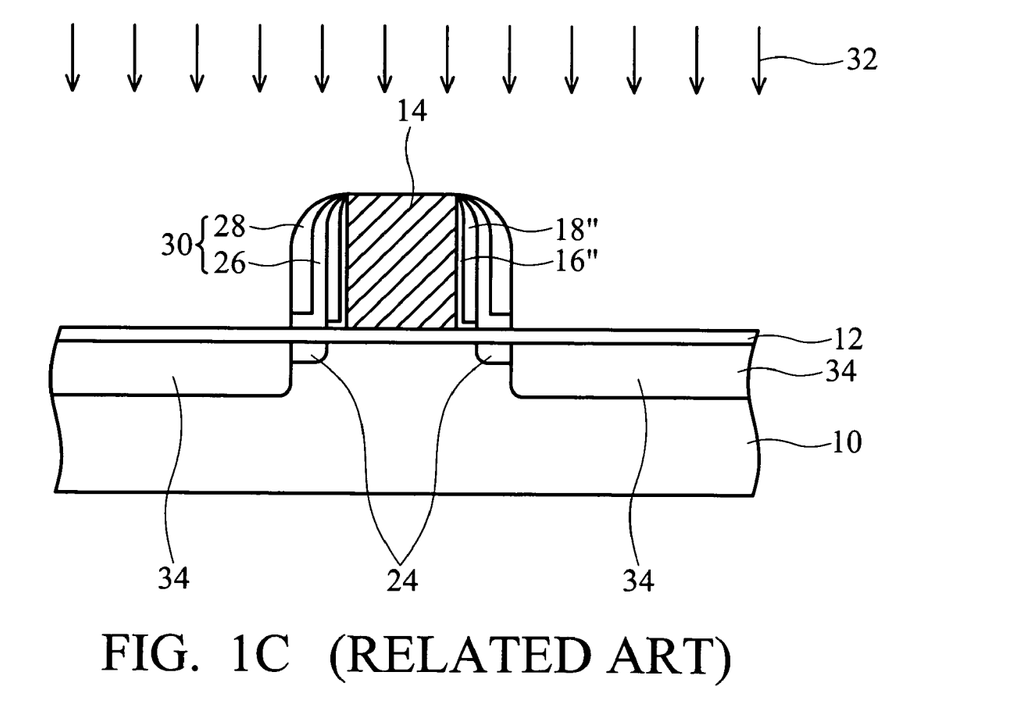

FIGS. 1A through 1C are cross-sectional diagrams illustrating a conventional method of forming a MOS transistor with offset spacers on sidewalls of a gate conductive layer. In FIG. 1A, a semiconductor silicon substrate 10 is provided with a gate oxide layer 12 and a gate conductive layer 14 patterned thereon successively. A chemical vapor deposition (CVD) process is performed to form a silicon oxide layer 16 of 20~40 Angstroms thick, and then a silicon nitride layer 18 of 100~150 Angstroms thick is conformally deposited on the silicon oxide layer 16.

In FIG. 1B, a dry etch process is used to remove certain portions of the silicon nitride layer 18 and the silicon oxide layer 16, thus remaining portions 18" and 16" of the silicon nitride layer 18 and the silicon oxide layer 16 along the sidewalls of the gate conductive layer 14. The silicon nitride layer 18" along the sidewalls of the gate conductive layer 14 is an offset spacer for a subsequent LDD ion implantation process. The silicon oxide layer 16" is a buffer layer for a stress-release issue of the silicon nitride offset spacer 18". An ion implantation process 22 is then performed with the silicon nitride offset spacer 18" as the mask to implant ions into the substrate 10, resulting in LDD regions 24 laterally adjacent to the exterior sidewalls of the silicon nitride offset spacer 18". In FIG. 1C, a main spacer structure 30 including a silicon oxide layer 26 and a silicon nitride layer 28 is formed on the exterior sidewalls of the silicon nitride offset spacer 18" by dielectric deposition and dry etch processes. Finally, an ion implantation process 32 is performed with the main spacer structure 30 as the mask to implant ions into the substrate 10, resulting in source/drain regions 34 laterally adjacent to the exterior sidewalls of the main spacer structure 30.

The aforementioned offset spacer formation, typically including deposition and dry etch processes, is a complex procedure with poor stability and high cost. As device size decreases below about 0.13 microns, the deposition and etching processes have extremely narrow process windows whereby dimensional variation undesirably alters critical dimension (CD) and electrical performance of the MOSFET device. Following the dry etch process for the offset spacer formation, an oxide stripping process with wet chemical immersion (e.g., in Caro's acid) causes the silicon substrate to suffer from surface damage and silicon loss, which becomes more serious when a post-LDD implant wet clean is subsequently carried out. In addition, considering a high-temperature annealing followed by the ion implantation process 22 for activating the implanted dopants of the LDD regions 24, problems of dosage control and dosage contamination still need to overcome.

Accordingly, what is needed in the art is a device and a method of manufacture thereof that accesses the above-discussed issues.

SUMMARY

It is an object of the present invention to provide an offset spacer to reduce overlap capacitance between a gate structure and an LDD region.

It is another object of the present invention to provide an offset spacer process to prevent a semiconductor substrate from silicon loss and surface damage.

It is another object of the present invention to provide a densified oxide layer as an offset spacer layer in a MOS transistor.

To achieve the above objectives, the present invention provides in one embodiment an offset spacer process for a MOS device as follows. A semiconductor substrate having a gate structure is provided. A first dielectric layer is overall deposited on the semiconductor substrate, in which a first portion of the first dielectric layer covers the sidewall of the gate structure, and a second portion of the first dielectric layer covers the surface of the semiconductor substrate. An ion implantation process is then performed to implant dopants into the substrate to form a first doped region laterally adjacent to the first portion of the first dielectric layer. Next, a second dielectric is deposited, and photolithography and dry etch processes are used to form sidewall spacers on the dielectric layer along the sidewall of the gate structure. Next, an ion implantation process is performed to implant dopants into the substrate to form a second doped region laterally adjacent to the sidewall spacers. Accordingly, the first portion of the first dielectric layer is used as an offset spacer. The first doped region is used as an LDD region. The second doped region is used as a source/drain region.

One feature of an embodiment of the present invention is that the offset spacer is formed by a blanket deposition of the first dielectric layer without extra photolithography and dry etch processes prior to an LDD ion implantation process.

Another feature of an embodiment of the present invention is that the second portion of the first dielectric layer remains on the LDD region during the ion implantation process to prevent silicon loss and dosage contamination.

BRIEF DESCRIPTION OF THE DRAWINGS

The aforementioned objects, features and advantages of this invention will become apparent by referring to the following detailed description of the preferred embodiment with reference to the accompanying drawings, wherein.

DESCRIPTION

Reference will now be made in detail to the present preferred embodiments of the invention, examples of which are illustrated in the accompanying drawings. Wherever possible, the same reference numbers are used in the drawings and the description to refer to the same or like parts.

As will be appreciated by persons skilled in the art from the discussion herein, the present invention has wide applicability to many manufacturers, factories and industries. For discussion purposes, the embodiments are made herein to semiconductor foundry manufacturing (i.e., wafer fabrication in an IC foundry). In the context of this disclosure, the term "semiconductor substrate" is defined to mean any construction comprising semiconductor material, including, but not limited to, bulk semiconductor materials such as a semiconductor wafer and semiconductor material layers. The term "substrate" refers to any supporting structures, including, but not limited to, the semiconductor substrate described above.

Figure 2A:
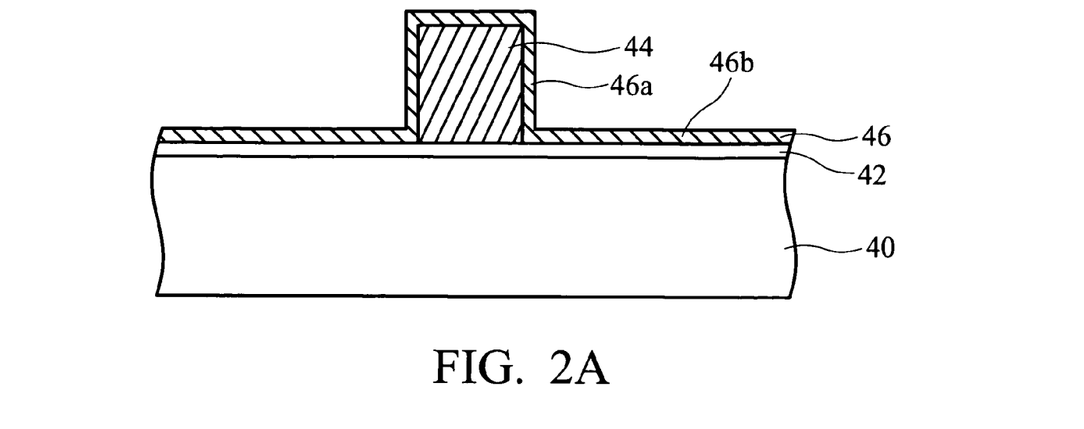
FIGS. 2A-2E are cross-sectional diagrams illustrating a method of forming a MOS transistor with an offset spacer according to one embodiment of the present invention.

FIGS. 2A-2E are cross-sectional diagrams illustrating an exemplary implementation of the method according to the present invention. In FIG. 2A, a semiconductor substrate 40 for manufacturing MOS transistors is provided. The substrate 40 may be a silicon substrate with or without an epitaxial layer. Alternatively, the substrate 40 may be a silicon-on-insulator substrate containing a buried insulator layer. It is understood that the type of the substrate 40 is a design choice dependent on the fabrication process being employed. The MOS transistors will be fabricated in n-type or p-type well regions that are defined in the substrate 40. A gate dielectric layer 42 is formed on the substrate 40 by thermal growth or deposition, and the dielectric material may be, for example, silicon oxide, silicon oxynitride, alternating layers of silicon oxide and silicon nitride, or combinations thereof. The thickness of the gate dielectric layer 42 is chosen specifically for the scaling requirements of the device technology. For 0.18-μm generation technology, a typical gate oxide thickness is 20±1.5 Angstroms. In one embodiment, the gate dielectric layer 42 has a thickness of from about 10 Angstroms to 350 Angstroms. A gate conductive layer 44 is formed on the gate dielectric layer 42 by using polysilicon, metal, or any suitable conductive material. A term "gate structure" refers to a stack structure, including, but not limited to, the gate conductive layer 44 and the gate dielectric layer 42 covered by the gate conductive layer 44. The gate dielectric layer 42 not covered by the gate conductive layer 44 may be optionally removed from the semiconductor substrate 40.

A first dielectric layer 46 is conformally formed on the gate conductive layer 44 and the gate dielectric layer 42 by a blanket deposition. In one embodiment of the present invention, the first dielectric layer 46 may be silicon oxide, silicon oxynitride, alternating layers of silicon oxide and silicon nitride, or combinations thereof, that subsequently serves the same function of an offset spacer layer. The blanket deposition can be carried out using any of a variety of techniques, including thermal oxidation, LPCVD (low-pressure chemical vapor deposition), APCVD (atmospheric-pressure chemical vapor deposition), PECVD (plasma-enhanced chemical vapor deposition) and future-developed deposition procedures. For example, an LPCVD or PECVD process with tetraethylorthosilicate (TEOS) and $O_3$ at a temperature between about 550° C. and 750° C. may be employed to form a TEOS oxide film as the first dielectric layer 46. The first dielectric layer 46 is between about 10 Angstroms to about 350 Angstroms thick. For example, the first dielectric layer 46 is less than about 150 Angstroms thick.

A first portion 46a of the first dielectric layer 46, e.g., a vertical portion, covers the sidewalls of the gate conductive layer 44 to serve as an offset spacer 46a for a subsequent LDD ion implantation process. A second portion 46b of the offset spacer layer 46, e.g., a horizontal portion, covers the gate dielectric layer 42 along the surface of the semiconductor substrate 40 to function as an out-diffusion stop layer, an etch stop layer and a stress-release layer in subsequent processes that will be discussed in detail later. One feature of the present invention is that the first dielectric layer 46 is a blanket deposition film covering the substrate 40 and the sidewalls and top of the gate conductive layer 44, thus saving extra steps and associated costs used in the conventional offset spacer process which includes photolithography, anisotropic dry etch and wet clean steps.

Figure 2B:
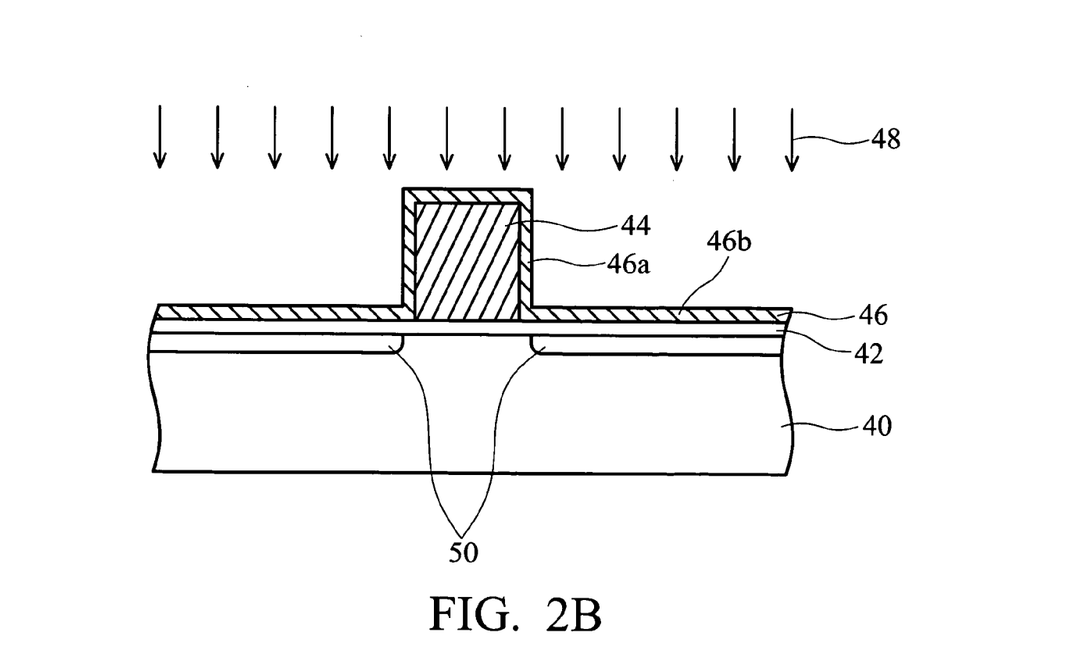

In FIG. 2B, an LDD ion implantation process 48 with various dopant species is used to form LDD regions 50 in the semiconductor substrate 40. The margin of each LDD region 50 is substantially aligned to the exterior sidewall of the offset spacer 46a. For PMOS transistors, the LDD ion implantation process 48 can use p-type dopants such as boron (B) and $BF_2$, for example. For NMOS transistors, the LDD ion implantation process 48 may use n-type dopants such as arsenic (As), antimony (Sb) and phosphorous (P). Other dopants such as those used to form the pocket regions may also be performed at this time. The LDD ion implantation process 48 may be performed at an energy between about 1 to about 100 KeV, at a dosage of between about $1 \times 10^{13}$ to about $1 \times 10^{15}$ atoms/cm$^2$. An LDD annealing process such as a high-temperature thermal treatment (e.g., a rapid thermal annealing (RTA) process) may then be employed to activate implanted dopants and reduce boron diffusion in the LDD regions 50.

During the LDD ion implantation process 48, the second portion 46b of the first dielectric layer 46 remaining on the LDD regions 50 can protect the semiconductor substrate 40 from surface damage. During the LDD annealing process, the second portion 46b can be an out-diffusion stop layer to prevent dosage contamination and improve dosage control, thus increasing resistance reliability of the LDD region 50. Moreover, since an extra thermal cycle is provided in the LDD annealing process, the first dielectric layer 46 becomes a more densified material that exhibits a low etch rate in many typical wet etchants available in the semiconductor industry, e.g. fluorine-based wet etchants such as HF. For example, comparing etch rates in a 100:1 HF solution for an oxide deposition, a densified oxide film exhibits an etch rate less than about 200 Angstroms/minute, and a baseline TEOS oxide film exhibits an etch rate about 300 Angstroms/minute. The densified characteristics of the first dielectric layer 46 can strengthen the sidewall spacer structure of the MOS transistor to improve reliability thereof.

Figure 2C:
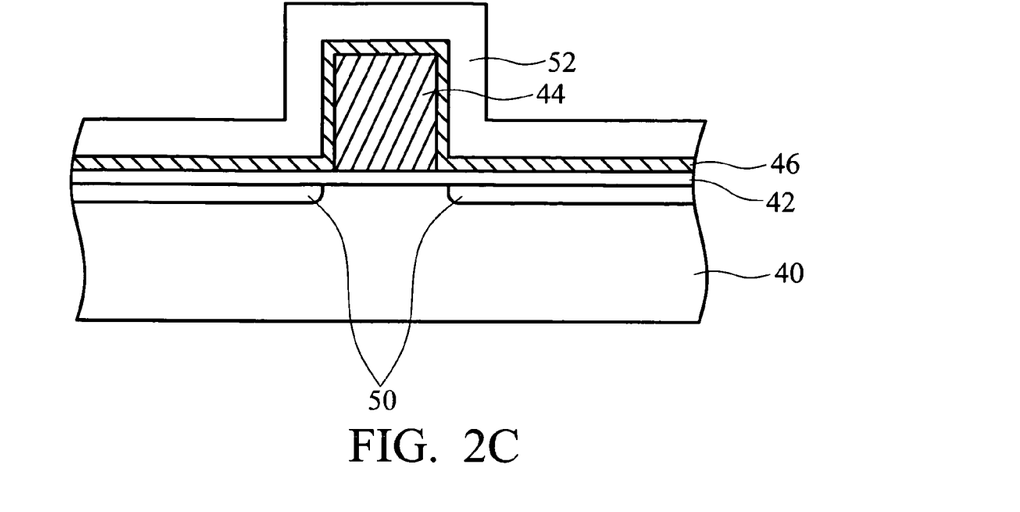
Figure 2D:
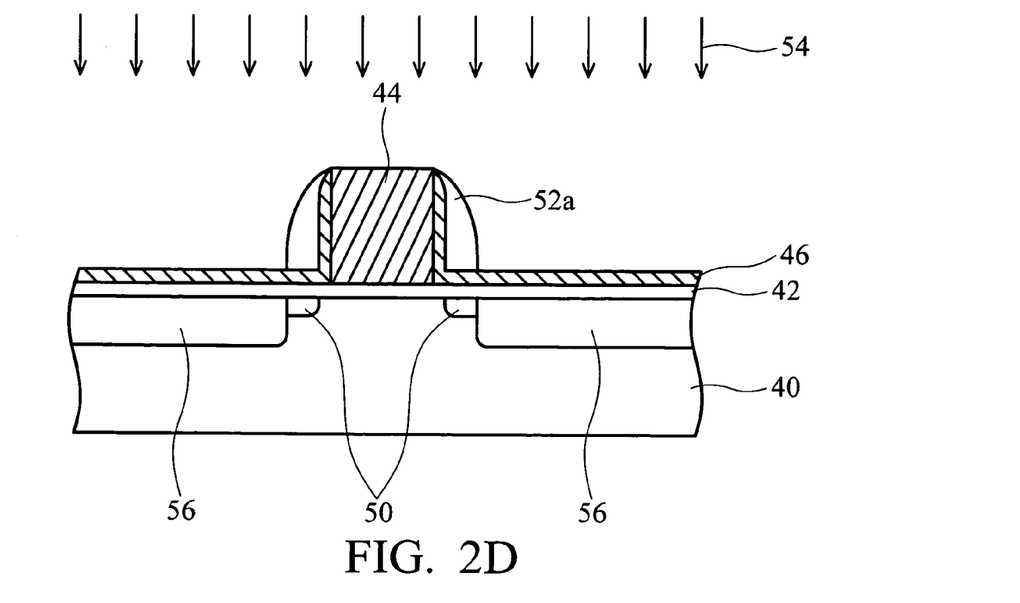
Figure 2E:
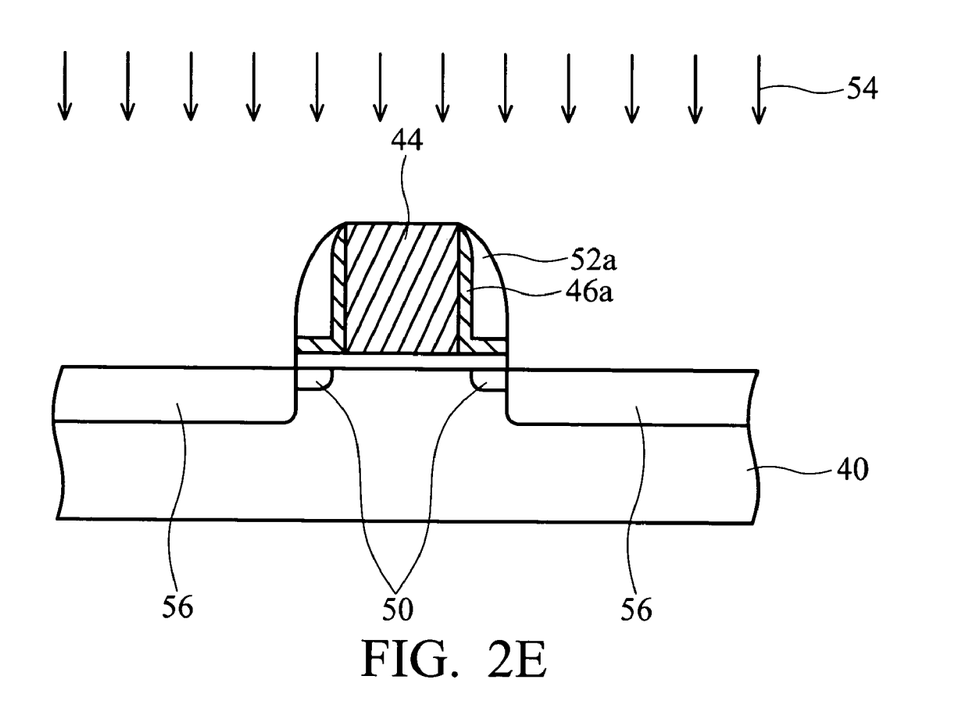

Following the formation of the LDD regions 50, main sidewall spacers and source/drain regions are formed on the semiconductor substrate 40, as shown in FIGS. 2C to 2E. Referring to FIG. 2C, a second dielectric layer 52 is deposited overlying the first dielectric layer 46. The second dielectric layer 52 may include, for example a silicon nitride layer, a silicon oxide layer, a silicon oxynitride layer, alternating layers of silicon oxide and silicon nitride, or combinations thereof, and may be formed by using a chemical vapor deposition (CVD) process, for example. In FIG. 2D, certain regions of the second dielectric layer 52 are etched and stopped on second portion 46b of the first dielectric layer 46 to form a main sidewall spacer 52a along the sidewalls of the gate conductive layer 44, in which the first dielectric layer 46 overlying the top of the gate conductive layer 44 is removed at this step. Advances in lithography and masking techniques and dry etch processes, such as RIE (Reactive Ion Etching) and other plasma etching processes, allow production of the main sidewall spacer structure 52a. For example, an RIE procedure, using $CHF_3$ as an etchant for the silicon oxide option, or using $Cl_2$ as an etchant for the silicon nitride option, is employed to form the main sidewall spacer structure 52a. One feature of the present invention is that the second portion 46b with densified characteristics can be an etch stop layer to increase the dry etch process window.

In FIG. 2E, a wet etch process is used to remove the exposed areas of the second portion 46b and the gate dielectric layer 42 outside the main sidewall spacer 52a in accordance with process requirements and product design rules. For example, an oxide stripping process with wet chemical immersion (e.g., in Caro's acid) may be performed to remove the oxide dielectric regions. The remaining portion of the first dielectric layer 46 becomes an L-shaped spacer that extends from the sidewall of the gate conductive layer 44 to the LDD region 50. One feature of the present invention is that the second portion 46b of densified characteristics can further increase the wet etch process window.

Next, a source/drain ion implantation process 54 is performed and the main sidewall spacer 52a is used as the mask to implant various dopant species into the semiconductor substrate 40, resulting in source/drain regions 56. The margin of the source/drain region 56 is substantially aligned to the exterior sidewalls of the main sidewall spacer 52a. For PMOS transistors, the source/drain ion implantation process 54 may use p-type dopants such as, for example boron (B) and $BF_2$. For NMOS transistors, the source/drain ion implantation process 54 may use n-type dopants such as, for example arsenic (As), antimony (Sb) and phosphorous (P). The source/drain ion implantation process 54 may be performed at an energy between about 1 to 100 KeV, at a dosage between about $5\times10^{13}$ to $1\times10^{16}$ atoms/cm$^2$. A high-temperature anneal treatment may be then performed to activate the implanted dopants in the source/drain regions 56.

Thus, a method for producing a sidewall spacer structure along opposite sidewalls of a gate structure in MOS transistors has been presented that allows reduction of overlap capacitance between the gate conductive layer 44 and each LDD region 50, more than 10% increase of operation speed, and great improvement in gate leakage and drain-induced barrier lowering (DIBL) effect. The formation of offset spacer 46a of the first dielectric layer 46 without the extra steps necessary in the conventional spacer layer formation including photolithography and anisotropic dry etch processes can simplify MOS transistor manufacturing procedure and lower processing costs. Also, an oxide stripping process with wet chemical immersion that usually accompanies the dry etch process is eliminated in the formation of the offset spacer 46a, thus preventing problems of silicon loss and surface damage to the semiconductor substrate 40. Further, the second portion 46b of the first dielectric layer 46 remaining overlying the LDD regions 50 can protect the semiconductor substrate 40 from surface damage, improve dosage control and prevent dosage contamination. In addition, the first dielectric layer 46 becomes a densified material due to an extra thermal cycle during the LDD annealing process, resulted in increased process windows for dry etch and wet etch processes.

Figure 3:
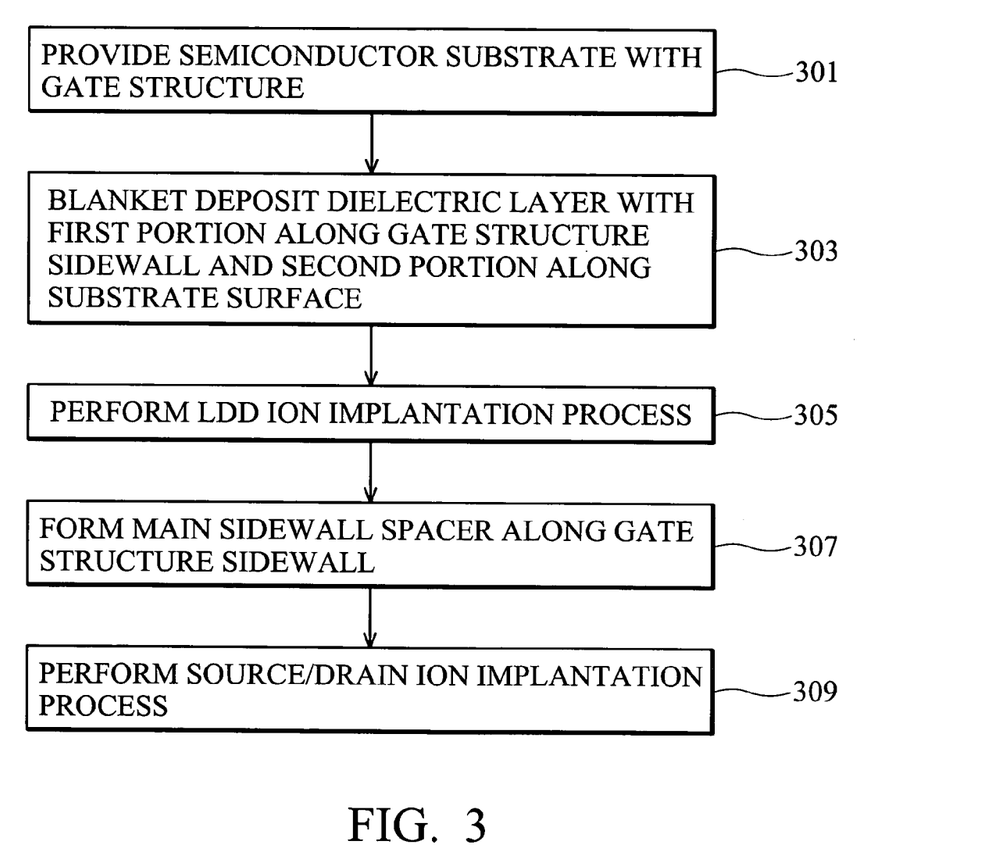
FIG. 3 is a process flow diagram according to one embodiment of the present invention.

FIG. 3 is a process flow diagram of the present invention. In process 301, a semiconductor substrate is provided with a gate structure. In process 303, a blanket deposition of a dielectric layer is formed overlying the semiconductor substrate. A first portion of the dielectric layer covers the sidewalls of the gate structure to serve as an offset spacer for a subsequent LDD process. A second portion of the dielectric layer covers the surface of the semiconductor substrate to function as an out-diffusion stop layer, an etch stop layer and a stress-release layer in subsequent processes. In process 305, an LDD ion implantation process is performed to implant dopants into the semiconductor substrate to form LDD regions that are substantially aligned to the edge of the first portion of the offset spacer layer. In process 307, a main sidewall spacer is formed on the dielectric layer along the sidewalls of the gate structure by deposition, photolithography and dry etching processes. In process 309, a source/drain ion implantation process is performed to implant dopants into the semiconductor substrate to form source/drain regions that are substantially aligned to the exterior sidewalls of the main sidewall spacer.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A method of forming an integrated circuit transistor, comprising:
 providing a semiconductor substrate with a gate structure formed thereon;
 forming at least one dielectric layer overlying the semiconductor substrate, wherein the at least one dielectric layer comprises at least one first portion along at least one sidewall of the gate structure, and at least one second portion outside the gate structure along the surface of the semiconductor substrate;
 forming at least one first doped region in the semiconductor substrate laterally adjacent to the at least one first portion of the at least one dielectric layer, wherein the at least one second portion of the at least one dielectric layer remains overlying the at least one first doped region;

forming a sidewall spacer overlying the at least one dielectric layer along the at least one sidewall of the gate structure, wherein the sidewall spacer is formed using a blanket deposition process and a dry etch process; and forming at least one second doped region in the semiconductor substrate laterally adjacent to the sidewall spacer.

2. The method of forming an integrated circuit transistor of claim 1, wherein a thickness of the at least one dielectric layer ranges from about 10 Angstroms to about 350 Angstroms.

3. The method of forming an integrated circuit transistor of claim 1, further comprising a step of removing exposed regions of the at least one dielectric layer before the formation of the at least one second doped region.

4. The method of forming an integrated circuit transistor of claim 1, wherein the formation of the at least one dielectric layer is a blanket deposition of silicon oxide, silicon oxynitride, alternating layers of silicon oxide and silicon nitride, or combinations thereof.

5. The method of forming an integrated circuit transistor of claim 1, wherein the formation of the at least one dielectric layer is a blanket deposition by a chemical vapor deposition (CVD) process using tetraethylorthosilicate (TEOS).

6. The method of forming an integrated circuit transistor of claim 1, wherein the sidewall spacer is silicon oxide, silicon oxynitride, alternating layers of silicon oxide and silicon nitride, or combinations thereof.

7. The method of forming an integrated circuit transistor of claim 1, wherein the at least one first doped region is formed using an ion implantation process and an annealing process.

8. The method of forming an integrated circuit transistor of claim 7, wherein after the annealing process, the at least one dielectric layer becomes a densified material which exhibits an etch rate less than about 200 Angstroms/minute in a 100:1 HF solution.

* * * * *